(12) United States Patent
Morozumi et al.

(10) Patent No.: US 8,262,202 B2
(45) Date of Patent: Sep. 11, 2012

(54) LIQUID EJECTING HEAD, LIQUID EJECTING APPARATUS AND PIEZOELECTRIC ELEMENT

(75) Inventors: Koichi Morozumi, Shiojiri (JP); Jiro Kato, Suwa (JP); Satoshi Denda, Suwa (JP); Ichiro Asaoka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 94 days.

(21) Appl. No.: 12/500,474

(22) Filed: Jul. 9, 2009

(65) Prior Publication Data

US 2010/0007705 A1   Jan. 14, 2010

(30) Foreign Application Priority Data

Jul. 10, 2008   (JP) ................................. 2008-180786

(51) Int. Cl.
*B41J 2/045* (2006.01)
(52) U.S. Cl. ............................... 347/71; 347/68; 347/72
(58) Field of Classification Search ........................ None
See application file for complete search history.

(56) References Cited

U.S. PATENT DOCUMENTS

| 2008/0043069 A1* | 2/2008 | Shimada et al. | 347/72 |
| 2008/0211880 A1* | 9/2008 | Hara et al. | 347/70 |

FOREIGN PATENT DOCUMENTS

| JP | 2000307163 A | * 11/2000 |
| JP | 2001-274472 | 10/2001 |

OTHER PUBLICATIONS

Callister Jr., William D., Materials Science and Engineering An Introduction. New York, John Wiley & Sons, Inc., 2003, pp. 174-176.*

* cited by examiner

*Primary Examiner* — Matthew Luu
*Assistant Examiner* — Erica Lin
(74) *Attorney, Agent, or Firm* — Workman Nydegger

(57) ABSTRACT

A liquid ejecting head including a pressure generating chamber that communicates with a nozzle opening that ejects liquid and a piezoelectric element that generates a pressure change in the pressure generating chamber. The piezoelectric element includes a first electrode, a piezoelectric body layer that is formed on the first electrode which includes a grain-shaped region, and a second electrode that is formed on a side of the piezoelectric body layer that is opposite to the first electrode.

17 Claims, 4 Drawing Sheets

LIQUID EJECTING HEAD, LIQUID EJECTING APPARATUS AND PIEZOELECTRIC ELEMENT

The entire disclosure of Japanese Patent Application No. 2008-180786, filed Jul. 10, 2008 is expressly incorporated herein by reference.

BACKGROUND OF THE INVENTION

1. Technical Field

The present invention relates to a liquid ejecting head. More particularly, the present invention relates to a liquid ejecting head and a liquid ejecting apparatus which are capable of ejecting liquid from a nozzle opening using a piezoelectric element that includes a first electrode, a piezoelectric body layer and a second electrode.

2. Related Art

Piezoelectric elements that are typically used as pressure generating units for ejecting liquid from a nozzle opening of an ink jet recording head are usually formed by interposing a dielectric film formed of a piezoelectric material, which exhibits an electromechanical conversion function, between two electrodes. In some instances, the dielectric film is comprised of crystallized piezoelectric ceramics. In the process of forming the piezoelectric element, after a lower electrode film is formed on one face of a substrate where a series of flow paths are formed using a sputtering method, or the like. Then, a piezoelectric body layer (dielectric film) is formed on the lower electrode film using a sol-gel method, an MOD method, or the like. An upper electrode film is then formed on the piezoelectric body layer using a sputtering method or the like. Finally, a patterning process is performed on the piezoelectric body layer and the upper electrode film, and the piezoelectric element is formed. An example of this formation method is described in Japanese Patent Application JP-A-2001-274472.

In such piezoelectric elements, when a voltage is applied, stress is applied to the piezoelectric body layer. One problem with this configuration is that this stress may cause cracks to form in the piezoelectric body layer. This is particularly troublesome, when the piezoelectric body layer is a thin film and the stress applied to the piezoelectric body layer is increased. In addition, when a path of a leakage current flowing or leakage path is formed between two electrodes in the piezoelectric body layer, the insulation of the electrodes is degraded, and accordingly, there is a problem that the piezoelectric element generates heat and is destroyed so as to be degraded.

Such a problem is not limited to piezoelectric elements that are used in an ink jet recording heads but also exists in piezoelectric elements that are used in other liquid ejecting heads that are capable of ejecting other types of liquids. In addition, the above-described problem exits in a piezoelectric elements that are used in devices other than liquid ejecting heads.

BRIEF SUMMARY OF THE INVENTION

An advantage of some aspects of the invention is a liquid ejecting head and a liquid ejecting apparatus having a piezoelectric element that can suppress generation of cracks in a piezoelectric body layer and has superior insulation properties.

A first aspect of the invention is a liquid ejecting head including a pressure generating chamber that communicates with a nozzle opening that ejects liquid and a piezoelectric element that generates a pressure change in the pressure generating chamber. The piezoelectric element includes a first electrode, a piezoelectric body layer that is formed on the first electrode which includes a grain-shaped region, and a second electrode that is formed on a side of the piezoelectric body layer that is opposite to the first electrode.

Because grain-shaped regions are formed in the piezoelectric body layer, the boundaries between the regions have a non-linear shape. Because of this non-linear shape, the deformation caused by stress in the piezoelectric element cannot easily propagate through the piezoelectric body layer, as compared to a case where the piezoelectric body layer has a crystalline structure with linear boundaries between the columnar regions. In addition, since the region boundary of the grain-shaped regions has a non-linear shape, leakage paths are less likely to form in the piezoelectric body layer, compared to a case where the region boundary has a linear shape, meaning that the insulation property of the piezoelectric body layer can be also be improved.

A second aspect of the invention comprises a liquid ejecting apparatus including the above-described liquid ejecting head. This results in a liquid ejecting apparatus that includes a liquid ejecting head having a piezoelectric element that can suppress generation of cracks in the piezoelectric body layer and has a superior insulation properties.

A third aspect of the invention is a piezoelectric element including a first electrode; a piezoelectric body layer that is formed on the first electrode which includes a grain-shaped region, and a second electrode that is formed on a side of the piezoelectric body layer that is opposite to the first electrode. As described above, the piezoelectric element has improved insulation properties and is able to suppress the effects of cracks formed in the piezoelectric element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail.

Embodiment 1

Figure 1:
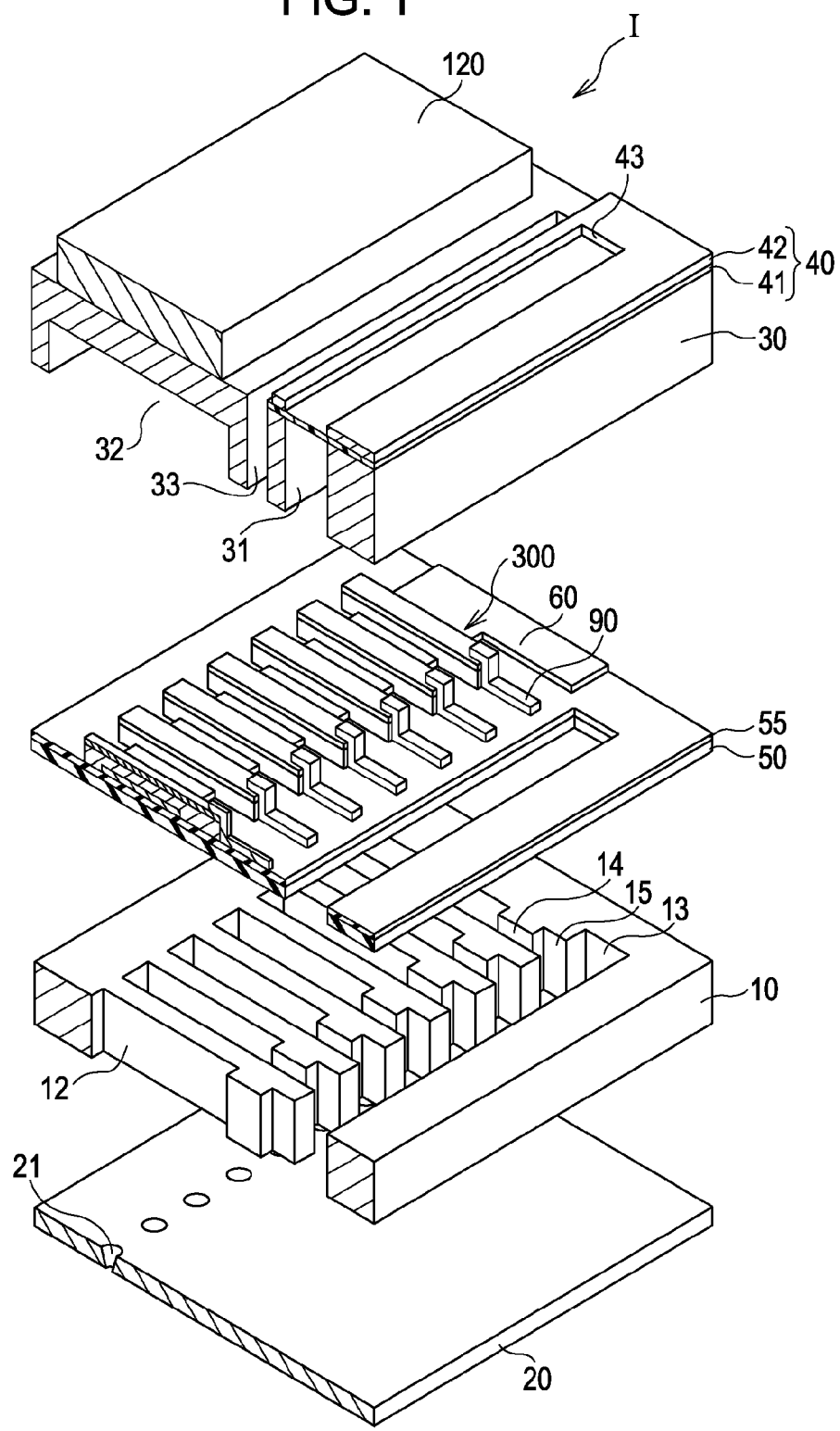
FIG. 1 is an exploded perspective view schematically showing the configuration of a recording head according to a first embodiment of the invention.
Figure 2A:
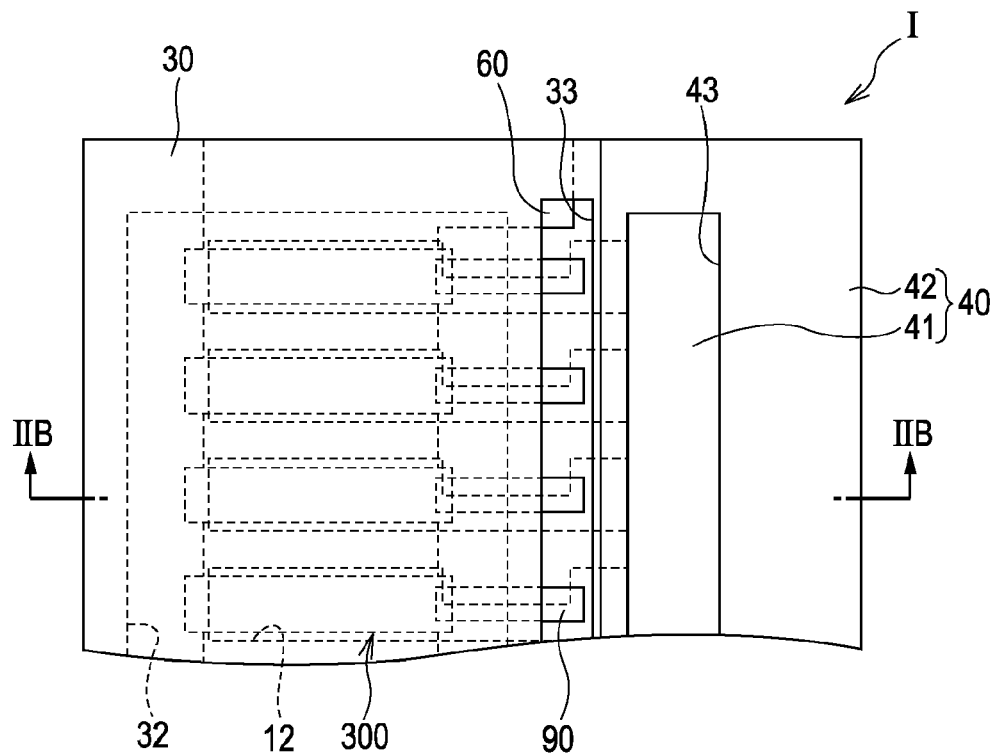
FIG. 2A is a plan view of the recording head according to the first embodiment.
Figure 2B:
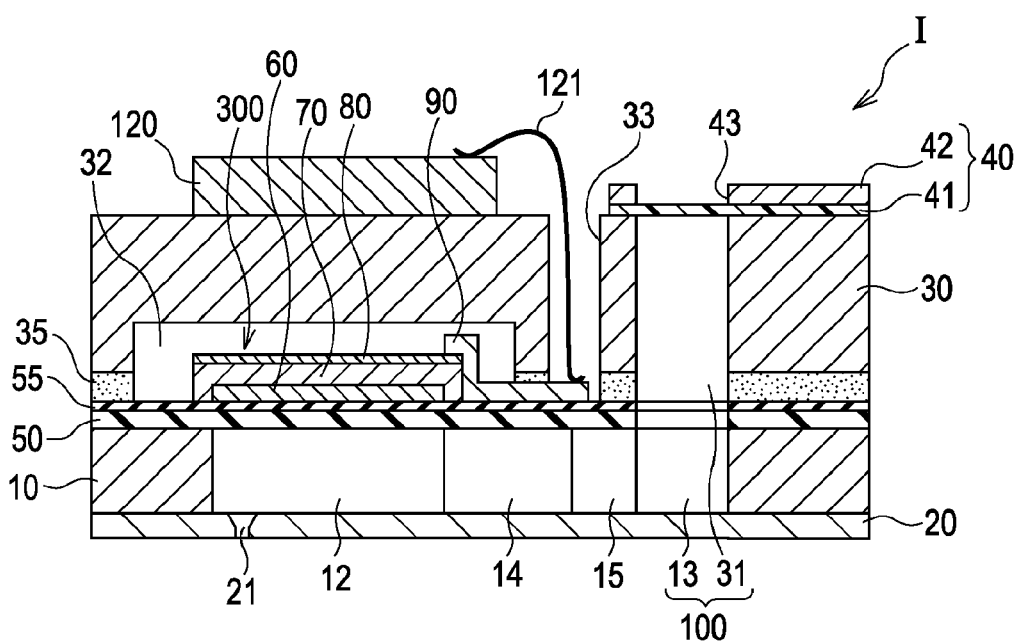
FIG. 2B is a cross-sectional view the recording head shown in FIG. 2A.
Figure 3A:
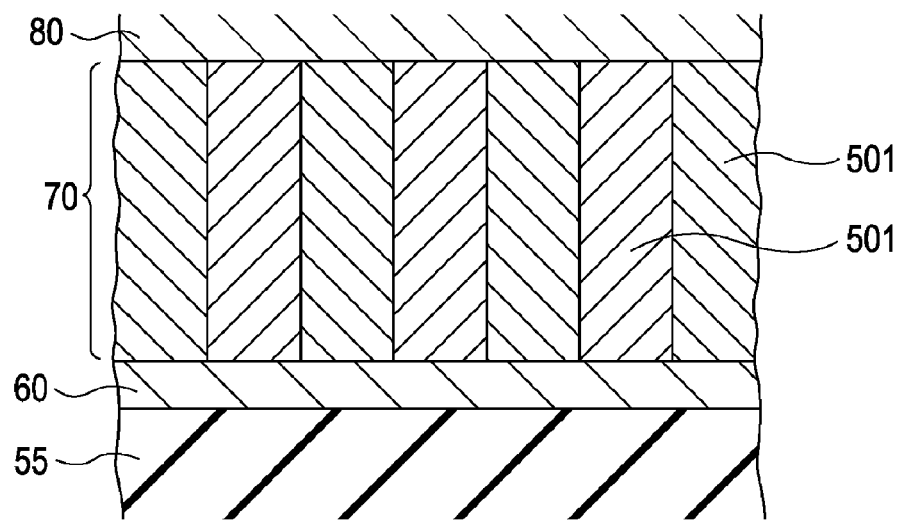
FIGS. 3A and 3B are enlarged cross-sectional views of major parts of the recording head according to the first embodiment.
Figure 3B:
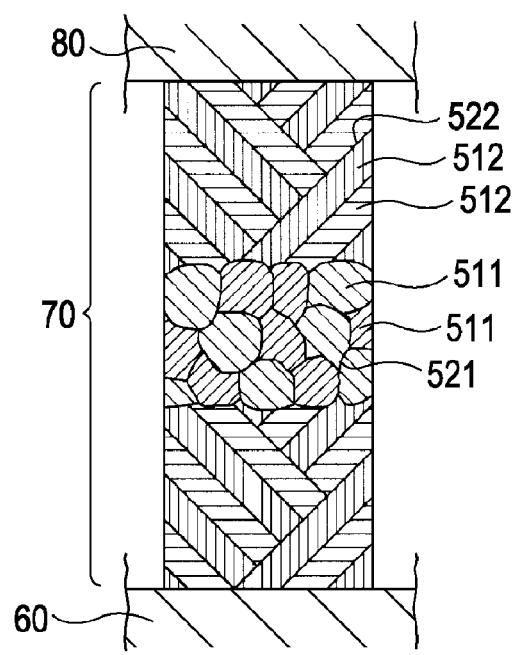

FIG. 1 is an exploded perspective view schematically showing the configuration of an ink jet recording head which is an example of a liquid ejecting head according to Embodiment 1 of the invention. FIGS. 2A and 2B are a plan view of FIG. 1 and a cross-sectional view taken along line IIB-IIB shown in FIG. 2A. FIGS. 3A and 3B are enlarged cross-sectional views of major parts of the ink jet recording head.

As shown in FIGS. 1, 2A and 2B, a flow path forming substrate 10 according to this embodiment is formed of a silicon monocrystal substrate. An elastic film 50 that is formed of silicon dioxide is formed on one side of the flow path forming substrate 10.

In the flow path forming substrate 10, a plurality of pressure generating chambers 12 is arranged in the width direction of the flow path forming substrate 10. In addition, a communication portion 13 is formed in an area located on the outer side of the flow path forming substrate 10 in the longitudinal direction of the pressure generating chamber 12. The communication portion 13 and the pressure generating chambers 12 are connected to each other through ink supplying paths 14 and communication paths 15 that are arranged for each pressure generating chamber 12. The communication portion 13 is communicated with a reservoir portion 31 of a protection substrate, described more fully below, and forms a part of a reservoir that becomes a common ink chamber of the pressure generating chambers 12. The ink supplying path 14 is formed to have a narrower width than the pressure generating chambers 12. The ink supplying path 14 maintains a constant flow path resistance for ink flowing from the communication portion 13 into the pressure generating chamber 12. In this embodiment, the ink supplying path 14 is formed by narrowing the width of the flow path on one side. However, the ink supplying path 14 may be formed by narrowing the width of the flow path on both sides. In addition, the ink supplying path 14 may be formed by narrowing the flow path in the thickness direction instead of narrowing the width of the flow path.

In addition, according to this embodiment, a liquid flowing path formed of the pressure generating chamber 12, the communication portion 13, the ink supplying path 14 and the communication path 15 is arranged in the flow path forming substrate 10.

In addition, a nozzle plate 20, in which a nozzle opening 21 is fixed on the opening face side of the flow path forming substrate 10 using an adhesive agent, a thermal welding film, or the like. The nozzle opening 21 communicates with an area near the end portion of each pressure generating chamber 12 on a side opposite to the ink supplying path 14. The nozzle plate 20, for example, is formed of glass, ceramics, a silicon monocrystal substrate, stainless steel, or the like.

On the other hand, the elastic film 50 described above is formed on the side of the flow path forming substrate 10 opposite to the opening face. An insulating film 55 is formed on the elastic film 50. In addition, on the insulating film 55, a first electrode 60 formed of platinum, or the like, a piezoelectric body layer 70, and a second electrode 80 formed of iridium or the like are formed to be laminated, forming a piezoelectric element 300. Here, the piezoelectric element 300 is represented by the elements including the first electrode 60, the piezoelectric body layer 70, and the second electrode 80. Generally, while any one electrode of the piezoelectric element 300 is used as a common electrode, the other electrode and the piezoelectric body layer 70 are configured by being patterned for each pressure generating chamber 12. In this embodiment, the first electrode 60 is used as the common electrode of the piezoelectric element 300, and the second electrode 80 is used as an individual electrode of the piezoelectric element 300. However, the first electrode 60 and the second electrode 80 may oppositely configured, so that the second electrode 80 serves as the common electrode while the first electrode 60 is used as the individual electrode. Thus, the specific configuration may vary based on the driving circuit or wirings. Here, the piezoelectric element 300 and a vibration plate that is displaced in accordance with driving of the piezoelectric element 300 are referred to collectively as an actuator device.

In addition, in the above-described example, the elastic film 50, the insulating film 55, and the first electrode 60 act as a vibration plate. However, it is apparent that the invention is not limited thereto. For example, only the first electrode 60 may be configured to act as the vibration plate without disposing the elastic film 50 and the insulating film 55. Alternatively, the piezoelectric element 300 may be configured to substantially serve as the vibration plate.

The piezoelectric body layer 70 is formed of a piezoelectric material, which is formed on the first electrode 60 and exhibits an electromechanical conversion function, and more particularly, is formed from a ferroelectric material that has a perovskite structure and contains Pb, Zr, and Ti as metal. For example, a ferroelectric material such as lead zirconium titanate (PZT) or the ferroelectric material to which metal oxide such as niobe oxide, nickel oxide, or magnesium oxide is added may be appropriately used for the piezoelectric body layer 70. In particular, lead titanate ($PbTiO_3$), lead zirconate titanate ($Pb(Zr, Ti)O_3$), lead zirconate ($PbZrO_3$), lead lanthanum titanate (($Pb, La), TiO_3$), lead lanthanum zirconate-titanate (($Pb, La) (Zr, Ti)O_3$), lead magnesium niobate zirconium titanate ($Pb(Zr, Ti) (Mg, Nb)O_3$), or the like may be used for the piezoelectric body layer 70.

The thickness of the piezoelectric body layer 70 is suppressed so as not to generate any cracks in the manufacturing process while being of an appropriate thickness so as to exhibit a sufficient displacement characteristic. For example, in this embodiment, the piezoelectric body layer 70 is formed to have a thickness of about 1 to 2 μm.

According to this embodiment, as shown in FIG. 3A that is a cross-sectional view of the piezoelectric element 300 in the thickness direction, a plurality of continuous grains 501 having a columnar shape may be formed in the piezoelectric body layer 70. The grain 501, as shown in FIG. 3B that is an enlarged cross-sectional view of one grain 501 shown in FIG. 3A, is configured by a plurality of regions. Here, the grain is an area of crystals having same crystal alignment, and the region is an area in which an internal electric field is formed in a same direction within the grain. For example, in the PZT that is aligned on a face of (001) in a monoclinic system, Ti and Zr that are B-site atoms can be moved in directions of four types. Accordingly, four types of regions are formed within the grain.

The regions that configure this grain 501 comprise grain-shaped regions 511 and band-shaped regions 512. In addition, the grain-shaped regions 511 are formed in the center portion of the piezoelectric body layer 70 in the thickness direction. Here, the grain-shaped region 511 is a region that is sphere-shaped or polygon-shaped. According to this embodiment, a layer is formed by aggregating a plurality of the grain-shaped regions 511 in the center portion of the piezoelectric body layer 70 in the thickness direction. On the other hand, the band-shaped grains 512 are formed on the first electrode 60 side and the second electrode 80 side of the piezoelectric body layer 70. Here, the band-shaped region 512 is a region that has a long and thin cross section and is band shaped. In this embodiment, a layer is formed by laminating a plurality of band-shaped regions 512 so as to be parallel to one another.

The grain-shaped region 511 is sphere-shaped or polygon-shaped as described above. Accordingly, as shown in the cross-sectional view of FIG. 3B, a region boundary 521 between two grain-shaped regions 511 is not linear-shaped but non-linear shaped, unlike a region boundary 522 between two band-shaped regions 512.

As described above, according to this embodiment, the grain-shaped regions 511 are formed in the piezoelectric body layer 70. Accordingly, the generation of cracks in the piezoelectric body layer 70 due to stress applied at the time of application of a voltage can be suppressed.

By comparison, in the piezoelectric body layer currently known in the art, the layer is formed by band-shaped regions, without any grain-shaped regions formed therein. In addition, the band-shaped region is long and thin and is band-shaped, and accordingly, the region boundary of the band-shaped regions has a linear shape. When a voltage is applied to the piezoelectric element which includes only the band-shaped regions, the crack due to the stress due to deformation easily propagates through the linear-shaped region boundaries 522 that are formed between the band-shaped regions 512.

However, according to this embodiment, a series of grain-shaped regions 511 are formed in the piezoelectric body layer 70. The region boundary 521 of the grain-shaped regions 511 has a non-linear shape. Accordingly, the deformation caused by the stress cannot easily propagate through this region boundary 521, as compared to a case where the region boundary has a linear shape like the region boundary 522 of the band-shaped regions 512. As a result, the generation of a crack in the piezoelectric body layer 70 due to stress can be more easily suppressed. In a case where the piezoelectric body layer 70 is a thin film as in this embodiment, stress of about several tens to several hundreds of MPa, which is stronger than a case where the piezoelectric body layer 70 is a thick film, is applied to the piezoelectric body layer 70 at the time of application of a voltage. However, according to this embodiment, the grain-shaped regions 511 are formed in the piezoelectric body layer 70. Therefore, generation of a crack can be suppressed, and whereby an ink jet recording head having superior durability can be implemented.

In addition, since the region boundary of the grain-shaped regions 511 has a non-linear shape, the region boundary cannot easily create a leakage path, as compared to a case where the region boundary has a linear shape. Accordingly, in this embodiment in which the grain-shaped regions are formed, it is possible to improve the insulation properties of the piezoelectric body layer 70.

In piezoelectric body layers currently known in the art, pinning of the region boundary occurs due to crystal defects in hard PZT, and accordingly, the region boundary can easily be a leakage path. More particularly, the piezoelectric body layers currently known are formed of band-shaped regions, and the region boundary of the band-shaped regions has a linear shape, and accordingly, the region boundary having the linear shape may form a leakage path. However, according to this embodiment, the grain-shaped regions 511 are formed, and the region boundary 521 of the grain-shaped regions 511 has a non-linear shape. Accordingly, the region boundary 521 of the grain-shaped regions 511 cannot easily be formed into a leakage path, compared to a case where the region boundary has a linear shape, that is, a case where there is the region boundary 522 of the band-shaped regions 512. Therefore, the insulation property of the piezoelectric body layer 70 can improved, while the deterioration of the piezoelectric element 300 due to heat generation or destruction of the piezoelectric element 300 that is caused by the leakage can also be prevented.

In addition, according to this embodiment, a plurality of the grain-shaped regions 511 are formed in the center portion of the piezoelectric body layer 70 in the thickness direction. Accordingly, a layer in which a plurality of the grain-shaped regions 511 is aggregated is formed in the center portion of the piezoelectric body layer 70 in the thickness direction, and therefore propagation of deformation due to stress can be blocked. In addition, by decoupling the leakage path having the linear shape that is formed by the region boundary 522 of the band-shaped regions 512, the insulation properties of the piezoelectric body layer 70 can be improved well.

The band-shaped region 512 has the amount of displacement that is larger than that of the grain-shaped region 511 and has a piezoelectric characteristic that is superior to that of the grain-shaped region 511. However, according to this embodiment, the grain-shaped regions 511 and the band-shaped regions 512 are mixed together. Accordingly, suppression of generation of cracks and an excellent insulation property can be achieved by using the grain-shaped regions 511. In addition, an excellent piezoelectric characteristic can be achieved by using the band-shaped regions.

In addition, according to this embodiment, the portion of the vibration plate of the piezoelectric body layer 70 that is located on the second electrode 80 includes band-shaped regions 512 having large amount of displacement. Since these areas have large amounts of displacement, the vibration plate may be vibrated more even for a same amount of displacement based on the leverage principle. Accordingly, the amount of displacement of the piezoelectric element 300 becomes larger than that of a case where only the band-shaped regions 512 are used. As a result, an ink jet recording head having a superior piezoelectric characteristics is formed.

Here, the shape of the region can be observed by using an electron microscope such as an SEM. When observation of the region is performed after a polling process for applying a voltage, the shape of the region can be observed clearly. Although FIGS. 3A and 3B show a state after the polling process, however, the grain-shaped regions and the band-shaped regions exist even before the polling process is performed in this embodiment.

A method of manufacturing the above-described piezoelectric body layer 70 is not particularly limited. For example, the piezoelectric body layer 70 may be formed by using a so-called sol-gel method in which the piezoelectric body layer 70 formed of metal oxide is acquired by coating and drying sol, which is acquired by dissolving and dispersing an organic metal compound into a solvent, so as to be gel, followed by baking the gel at a high temperature. In addition, the method of manufacturing the piezoelectric body layer 70 is not limited to the above-described sol-gel method. For example, an MOD (metal-organic decomposition) method, a sputtering method, or the like may be used as the method of manufacturing the piezoelectric body layer 70.

In particular, a piezoelectric body precursor film is formed by coating a sol (solution) containing an organic metal compound on the first electrode 60 using a coating process, and heating the piezoelectric body precursor film so as to dry the film. The organic components included in the piezoelectric body precursor film are withdrawn as $NO_2$, $CO_2$, $H_2O$, and the like by heating the dried piezoelectric body precursor film (a degreasing process). Then, the piezoelectric body precursor film is heated so as to be crystallized in a baking process, in order to form the piezoelectric body layer 70 can be manufactured. In addition, by repeating the coating process, the drying process, the degreasing process, and the baking process several times, a piezoelectric body layer that is formed of a plurality of layers of piezoelectric body films may be formed. In this embodiment, a piezoelectric body layer that is formed of 12 layers of piezoelectric body films is formed. In addition, as a sol used for coating in the coating process, a sol having a same relative proportion of each component may be used. However, a sol having different relative proportions of the components may be used.

Here, in the manufacturing process of the above-described piezoelectric body layer 70, the band-shaped regions 512 may be formed, for example, by performing the drying process at a temperature of 150 to 170° C. for 8 to 30 minutes, performing the greasing process at about 300 to 400° C. for about 10 to 30 minutes, and performing the baking process at about 650 to 800° C. for 5 to 30 minutes with the temperature increasing at a rate equal to or smaller than 15° C./sec.

Then, in the manufacturing process of the above-described piezoelectric body layer 70, the grain-shaped regions 511 can be formed by adjusting the manufacturing conditions of the piezoelectric body layer 70 including conditions of the baking process such as the relative proportions of components contained in the sol used for coating and the like, the number of times of coating, the baking temperature, the temperature increasing rate, and the like and adjusting the balance of the manufacturing conditions. For example, when the baking temperature is lowered, the grain-shaped regions 511 tend to be formed easily, although the formation of the grain-shaped regions 511 depends on other manufacturing conditions. In addition, when the amount of lead that is contained in the sol is increased, the grain-shaped regions 511 tend to be formed easily, although the formation of the grain-shaped regions 511 depends on other manufacturing conditions. For example, when the piezoelectric body layer 70 that is formed of a plurality of layers of piezoelectric films is to be formed, the grain-shaped regions 511 can be formed by having the amount of lead contained in a sol that is used for coating an area in which the grain-shaped regions 511 are desired to be formed, made to be larger than that of a sol that is used for coating an area in which the band-shaped regions 512 are desired to be formed by using sols which have different relative proportions of the components used in the coating process.

As described above, by adjusting the manufacturing conditions of the piezoelectric body layer 70 and the balance of the manufacturing conditions, the grain-shaped regions 511 can be formed. According to this embodiment, the piezoelectric body layer 70 is formed such that the grain-shaped regions 511 are formed on the piezoelectric body films of the 5th layer to the 7th layer, while the band-shaped regions 512 are formed on the 1st layer to the 4th layer and the 8th layer to the 12th layer.

In addition, a lead electrode 90, for example, formed of gold (Au) or the like that is extracted from near the end portion of the ink supplying path 14 side and is disposed to extend up to a position located on the insulating film 55 is connected to each second electrode 80 comprising the individual electrode of the piezoelectric element 300.

A protection substrate 30 that has the reservoir portion 31 configuring at least a part of a reservoir 100 is bonded through an adhesive agent 35 on the flow path forming substrate 10 on which the above-described piezoelectric elements 300 are formed. That is, the protection substrate 30 is formed over the first electrode 60, the insulating film 55, and the lead electrode 90. According to this embodiment, the reservoir portion 31 is formed so as to pass through the protection substrate 30 in the thickness direction and extend in the width direction of the pressure generating chambers 12. As described above, the reservoir portion 31 is communicated with the communication portion 13 of the flow path forming substrate 10 and configures a reservoir 100 that becomes the common ink chamber of the pressure generating chambers 12. In addition, it may be configured that the communication portion 13 of the flow path forming substrate 10 is divided into a plurality of parts for each pressure generating chamber 12, and only the reservoir portion 31 is configured as the reservoir.

In addition, for example, it may be configured that only the pressure generating chamber 12 is disposed in the flow path forming substrate 10, and the ink supplying path 14 that allows the reservoir and each pressure generating chamber 12 to be communicated with each other may be disposed in a member (for example, the elastic film 50, the insulating film 55, or the like) that is interposed between the flow path forming substrate 10 and the protection substrate 30.

In addition, a piezoelectric element holding portion 32 having a space that does not block movement of the piezoelectric elements 300 is formed in an area of the protection substrate 30 that faces the piezoelectric elements 300. So as long as the piezoelectric element holding portion 32 has a space that does not block the movement of the piezoelectric elements 300, the space may be sealed or may not be sealed.

It is preferable that a material such as glass, a ceramic material or the like that has a same rate of thermal expansion as that of the flow path forming substrate 10 is used for the protection substrate 30. In this embodiment, the protection substrate 30 is formed by using a silicon monocrystal substrate that is formed of a same material as that of the flow path forming substrate 10.

In addition, a through hole 33 that passes through the protection substrate 30 in the thickness direction is formed in the protection substrate 30. In addition, a portion of each lead electrode 90 near the end portion that is extracted from each piezoelectric element 300 is disposed to be exposed to the inside of the through hole 33.

In addition, a driving circuit 120 that is used for driving the piezoelectric elements 300 arranged to be parallel to one another is fixed on the protection substrate 30. As the driving circuit 120, for example, a circuit substrate, a semiconductor integrated circuit (IC), or the like may be used. In addition, the driving circuit 120 and the lead electrodes 90 are electrically connected to each other through a connection wiring 121 that is formed of a conductive wire such as a bonding wire.

In addition, a compliance substrate 40 that is formed of a sealing film 41 and a fixing plate 42 is bonded on the protection substrate 30. Here, the sealing film 41 is formed of a flexible material having low rigidity, and one-side face of the reservoir portion 31 is sealed by the sealing film 41. The fixing plate 42 is formed of a relatively hard material. An area of the fixing plate 42 that faces the reservoir 100 becomes an opening portion 43 that is completely removed in the thickness direction. Accordingly, one-side face of the reservoir 100 is sealed only by the sealing film 41 that has flexibility.

According to the ink jet recording head of the above-described embodiment, the inside is filled with ink from the reservoir 100 up to the nozzle opening 21 by inserting ink from an ink introducing opening that is connected to an external ink supplying unit not shown in the figure. Then, a voltage is applied between the first electrode 60 and the second electrode 80 corresponding to each pressure generating chamber 12 in accordance with a record signal transmitted from the driving circuit 120, whereby the elastic film 50, the insulating film 55, the first electrode 60, and the piezoelectric body layer 70 are deformed so as to be bent. This causes the pressure inside each pressure generating chamber 12 to increase, causing ink droplets to be ejected from the nozzle opening 21.

Other Embodiments

An embodiment of the invention has been described as above. However, the basic configuration according to an embodiment of the invention is not limited thereto. For example, in the above-described Embodiment 1, the grain-shaped regions 511 are formed in the center portion of the piezoelectric body layer 70 in the thickness direction, and the band-shaped regions 512 are formed on the first electrode side and the second electrode side. However, the invention is not limited thereto. For example, it may be configured that the grain-shaped regions 511 are formed in the center portion of the piezoelectric body layer 70 and extend through the thickness direction to the first electrode side, with the band-shaped regions 512 being formed on the remaining second electrode side. Alternatively, it may be configured that the grain-shaped regions 511 are formed only near the first electrode, and the band-shaped regions 512 are formed in the remaining area. In addition, although in results in a piezoelectric element 300 with lower displacement, it is possible that the piezoelectric body layer 70 comprises only the grain-shaped regions 511 without any band-shaped regions 512.

The crystal structure of the piezoelectric body layer 70 may be any one of the rhombohedral crystal, the tetragonal crystal, or the monoclinic crystal. In addition, the crystal structure may be aligned giving priority to any one of a (100) surface, a (110) surface, a (001) surface, and a (111) surface. In addition, control of the crystal structure or the alignment may be performed by using a general method, for example, a method in which a layer that controls the alignment of Ti or the like is disposed.

Figure 4:
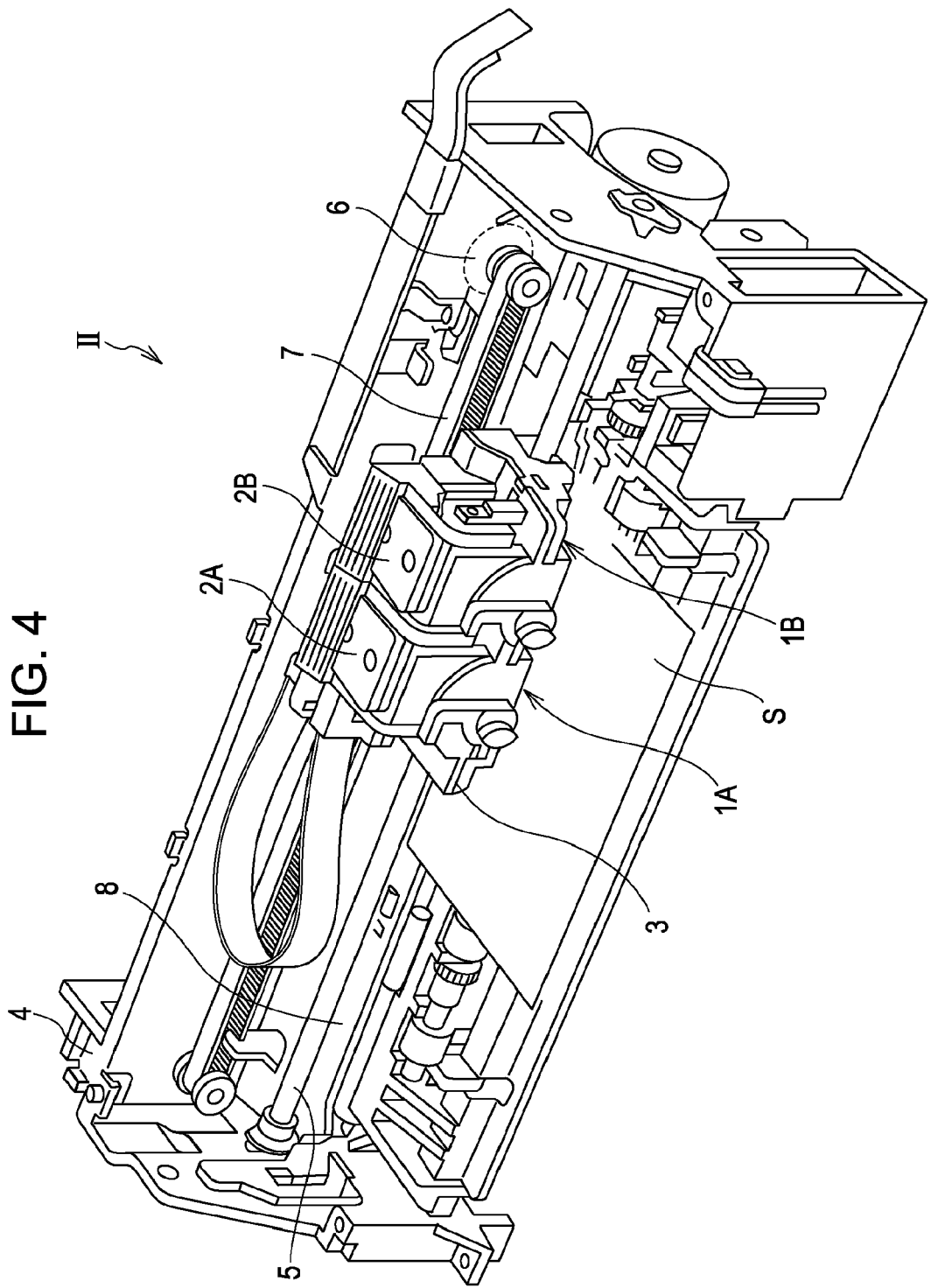
FIG. 4 is a diagram showing a schematic configuration of a recording apparatus according to an embodiment of the invention.

In addition, the ink jet recording head described above comprises a part of a recording head unit that includes an ink flowing path communicated with an ink cartridge or the like and is mounted in an ink jet recording apparatus. FIG. 4 is a schematic diagram showing an example of the ink jet recording apparatus.

In an ink jet recording apparatus shown in FIG. 4, cartridges 2A and 2B, which configure the ink supplying unit, are disposed so as to be detachably attached to recording head units 1A and 1B having the ink jet recording heads, which are formed as described above. In addition, a carriage 3 in which the recording head units 1A and 1B are mounted is disposed in a carriage shaft 5, which is installed to an apparatus main body 4, so as to be freely movable in the shaft direction. These recording head units 1A and 1B, for example, are assumed to eject a black ink composition and a color ink composition, respectively.

Then, as the driving force of a driving motor 6 is transferred to the carriage 3 through a plurality of gears not shown in the figure and a timing belt 7, the carriage 3 in which the recording head units 1A and 1B are mounted is moved along the carriage shaft 5. On the other hand, a platen 8 is disposed along the carriage shaft 5 in the apparatus main body 4. A recording sheet S that is a recording medium such as a paper sheet is fed by a paper feed roller not shown in the figure while being wound around the platen 8.

In addition, in the above-described Embodiment 1, the ink jet recording head has been described as an example of a liquid ejecting head. However, the invention may also be used in other liquid ejecting heads which eject liquid other than ink, as well. Examples of other types of liquid ejecting heads include various recording heads that are used as an image recording apparatus such as a printer, a coloring material ejecting head that is used for manufacturing a color filter of a liquid crystal display or the like, an electrode material ejecting head that is used for forming an electrode of an organic EL display, an FED (electric-field emission display), or the like, a bioorganic material ejecting head that is used for manufacturing a bio chip, and the like.

In addition, the invention is not limited to a piezoelectric element mounted in a liquid ejecting head that is represented by an ink jet recording head and may be applied to a piezoelectric element that is mounted in any other apparatus.

What is claimed is:

1. A piezoelectric element comprising:
   a first electrode;
   a piezoelectric body layer that is formed above the first electrode; and
   a second electrode that is formed above the piezoelectric body layer,
   wherein the piezoelectric body layer includes band-shaped regions and grain-shaped regions, wherein region boundaries between the band-shaped regions are linear shaped and wherein region boundaries between the grain-shaped regions are non-linear shaped, and
   wherein the grain-shaped regions are formed at least in a center portion of the piezoelectric body layer in the thickness direction and the band-shaped regions are formed at least on the first electrode side,
   wherein a crystal alignment of the band-shaped regions is different from a crystal alignment of the grain-shaped regions.

2. The piezoelectric element according to claim 1, wherein the band-shaped region is formed at least on the second electrode side of the piezoelectric body layer.

3. The piezoelectric element according to claim 1, wherein the piezoelectric body layer contains lead, zirconium, and titanium.

4. A liquid ejecting head comprising the piezoelectric element according to claim 1.

5. A liquid ejecting apparatus comprising the liquid ejecting head according to claim 4.

6. A piezoelectric element comprising:
   a first electrode;
   a piezoelectric body layer that is formed above the first electrode; and
   a second electrode that is formed above the piezoelectric body layer,
   wherein the piezoelectric body layer includes first regions that are substantially spherical and/or substantially polyhedral in shape at least in a center portion of the piezoelectric body layer in the thickness direction and second regions,
   wherein boundaries between the first regions in the center portion are non-linear shaped, and
   wherein a crystal alignment of the second regions is different from a crystal alignment of the first regions.

7. The piezoelectric element according to claim 6, wherein the piezoelectric body layer further includes a band-shaped region.

8. The piezoelectric element according to claim 7, wherein the band-shaped region is formed at least on the second electrode side of the piezoelectric body layer.

9. The piezoelectric element according to claim 6, wherein the piezoelectric body layer contains lead, zirconium, and titanium.

10. A liquid ejecting head comprising the piezoelectric element according to claim 6.

11. A liquid ejecting apparatus comprising the liquid ejecting head according to claim 10.

12. A piezoelectric element comprising:
    a first electrode;
    a piezoelectric body layer that is formed above the first electrode, the piezoelectric body layer including a first region having a first crystal alignment and a second region having a second crystal alignment; and
    a second electrode that is formed above the piezoelectric body layer,
    wherein the first region of the piezoelectric body layer includes a plurality of grain-shaped regions that are bounded by non-linear shaped boundaries at least in a center portion of the piezoelectric body layer in the thickness direction and band-shaped regions at least at the first electrode side in the thickness direction, the band-shaped regions bounded by linear shaped boundaries.

13. The piezoelectric element according to claim 12, wherein the piezoelectric body layer further includes a band-shaped region.

14. The piezoelectric element according to claim 13, wherein the band-shaped region is formed at least on the second electrode side of the piezoelectric body layer.

15. The piezoelectric element according to claim 12, wherein the piezoelectric body layer contains lead, zirconium, and titanium.

16. A liquid ejecting head comprising the piezoelectric element according to claim 12.

17. A liquid ejecting apparatus comprising the liquid ejecting head according to claim 16.

* * * * *